US008613860B2

(12) United States Patent
Chowdhury et al.

(10) Patent No.: US 8,613,860 B2
(45) Date of Patent: *Dec. 24, 2013

(54) GROUP III-NITRIDE LAYERS WITH PATTERNED SURFACES

(75) Inventors: Aref Chowdhury, Berkeley Heights, NJ (US); Hock Ng, Westfield, NJ (US); Richart Elliott Slusher, Lebanon, NJ (US)

(73) Assignee: Alcatel Lucent, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/248,394

(22) Filed: Sep. 29, 2011

(65) Prior Publication Data

US 2012/0028448 A1 Feb. 2, 2012

Related U.S. Application Data

(60) Continuation of application No. 12/315,202, filed on Dec. 1, 2008, now Pat. No. 8,070,966, which is a division of application No. 11/442,032, filed on May 27, 2006, now Pat. No. 7,468,578, which is a continuation of application No. 11/180,350, filed on Jul. 13, 2005, now Pat. No. 7,084,563, which is a division of application No. 10/397,799, filed on Mar. 26, 2003, now Pat. No. 6,986,693.

(51) Int. Cl.
| | |
|---|---|
| *C25F 3/00* | (2006.01) |
| *C23F 1/00* | (2006.01) |
| *C03C 15/00* | (2006.01) |
| *C03C 25/68* | (2006.01) |
| *H01L 21/302* | (2006.01) |
| *H01L 21/461* | (2006.01) |

(52) U.S. Cl.
USPC ............................................ 216/11

(58) Field of Classification Search
None
See application file for complete search history.

(56) References Cited

PUBLICATIONS

Weyher, J. L. et al., Chemical Polishing of bulk and epitaxial GaN, Journal of Crystal Growth, vol. 182, Issues 1-2 , Dec. 1, 1997, pp. 17-22.
English Abstract of Japanese Patent Publication JP2000149765(A), May 30, 2000, 1 pg.
Japanese Laid-Open Patent Application 2000-149765, May 30, 2000, pp. 1-8.
English Abstract of Japanese Patent Publication JPH10233385(A), Sep. 2, 1998, 1 pg.
Japanese Laid-Open Patent Application 10-233385, Sep. 2, 1998, 7 pgs.
English Abstract of Japanese Patent Publication JPH07335116(A), Dec. 22, 1995, 1 pg.
Japanese Laid-Open Patent Application 7-335116, Dec. 22, 1995, 7 pgs.
English Abstract of Japanese Patent Publication JP2001338568(A), Dec. 7, 2001, 1 pg.
Japanese Laid-Open Patent Application 2001-338568, Dec. 7, 2001, pp. 1-20.
Chowdhury, Aref et al., U.S. Appl. No. 12/315,202, filed Dec. 1, 2008, "Group III- Nitride Layers With Patterned Surfaces", 21 pgs.

*Primary Examiner* — Nadine G Norton
*Assistant Examiner* — Stephanie Duclair
(74) *Attorney, Agent, or Firm* — J. F. McCabe

(57) ABSTRACT

A fabrication method produces a mechanically patterned layer of group III-nitride. The method includes providing a crystalline substrate and forming a first layer of a first group III-nitride on a planar surface of the substrate. The first layer has a single polarity and also has a pattern of holes or trenches that expose a portion of the substrate. The method includes then, epitaxially growing a second layer of a second group III-nitride over the first layer and the exposed portion of substrate. The first and second group III-nitrides have different alloy compositions. The method also includes subjecting the second layer to an aqueous solution of base to mechanically pattern the second layer.

21 Claims, 5 Drawing Sheets

GROUP III-NITRIDE LAYERS WITH PATTERNED SURFACES

This application is a continuation of application Ser. No. 12/315,202, filed Dec. 1, 2008, now U.S. Pat. No. 8,070,966, which is a divisional of application Ser. No. 11/442,032, filed May 27, 2006, now U.S. Pat. No. 7,468,578, which is a continuation of application Ser. No. 11/180,350, filed Jul. 13, 2005, now U.S. Pat. No. 7,084,563, which is a divisional of application Ser. No. 10/397,799, filed Mar. 26, 2003 now U.S. Pat. No. 6,986,693.

BACKGROUND

1. Field of the Invention

The invention relates to electrical and optical devices that incorporate crystalline group III-nitrides.

2. Discussion of the Related Art

Crystalline group III-nitride semiconductors are used in both electrical devices and optical devices.

With respect to electrical devices, group III-nitrides have been used to make field-emitters. A field-emitter is a conductive structure with a sharp tip. The sharp tip produces a high electric field in response to being charged. The high electric field causes electron emission from the tip. For this reason, an array of field emitters can operate a phosphor image screen.

One prior art method has fabricated arrays of field-emitters from group III-nitrides. Group III-nitrides have chemical and mechanical stability due to the stability of the group III atom-nitrogen bond. Such stability is very desirable in devices that use an array of field-emitters.

The prior art method grows the field emitters from group III-nitrides. The growth method includes epitaxially growing a gallium nitride (GaN) layer on a sapphire substrate, forming a $SiO_2$ mask on the GaN layer, and epitaxially growing pyramidal GaN field-emitters in circular windows of the mask. While the growth method produces field-emitters of uniform size, the field emitters do not have very sharp tips. Sharper tips are desirable to produce higher electron emission rates and lower turn on voltages.

With respect to optical devices, group III-nitrides have high refractive indices. Materials with high refractive indices are desirable in the manufacture of photonic bandgap structures. For a fixed photonic bandgap, such materials enable making a photonic bandgap structure with larger feature dimensions than would be possible if the structure was made from a lower refractive index material.

One method for making a planar photonic bandgap structure involves dry etching a smooth layer of group III-nitride. Unfortunately, the chemical stability of group III-nitrides causes dry etchants to have a low selectivity for the group III-nitride over mask material. For that reason, a dry etch does not produce a deep surface relief in a layer of group III-nitride. Consequently, the thy-etch method only produces thin planar photonic bandgap structures from group III-nitrides.

Unfortunately, light does not efficiently edge couple to thin planar structures. For this reason, it is desirable to have a method capable of fabricating a photonic bandgap structure with a higher surface relief from a group III-nitride.

BRIEF SUMMARY

Herein a mechanically patterned surface has an airily of deformations therein, e.g., an array of holes, trenches, or physically rough regions.

Various embodiments provide methods for fabricating layers of group III-nitride with mechanically patterned surfaces. The patterned surfaces provide functionalities to the resulting structures. The fabrication methods exploit the susceptibility of nitrogen-polar (N-polar) group III-nitride layers to attack by strong bases. The methods use basic solutions to wet etch a layer of group III-nitride in a manner that produces a patterned surface. Exemplary patterned surfaces provide photonic bandgap structures and field-emitter arrays.

In a first aspect, the invention features a fabrication method. The method includes providing a crystalline substrate and forming a first layer of a first group III-nitride on a planar surface of the substrate. The first layer has a single polarity and also has a pattern of holes or trenches that expose a portion of the substrate. The method includes epitaxially growing a second layer of a second group III-nitride over both the first layer and the exposed portion of substrate. The first and second group III-nitrides have different alloy compositions. The method includes subjecting the second layer to an aqueous solution of base to mechanically pattern the second layer.

In a second aspect, the invention features an apparatus with a mechanically patterned surface. The apparatus includes a crystalline substrate with a planar surface and a plurality of pyramidal field-emitters located over a portion of the surface. The apparatus includes a layer of a first group-III nitride, which is located on another portion of the surface, and a layer of a second group III-nitride, which is located over the layer of the first group III-nitride. The layer of the second group III-nitride is free of pyramidal surface structures. The field-emitters include the second group III-nitride. The first and second group III-nitrides have different alloy compositions.

In a third aspect, the invention features an apparatus that includes a crystalline substrate and a mechanically patterned layer of a first group III-nitride duct is located on a planar surface of the substrate. The apparatus also includes a layer of a second group III-nitride that is located on the mechanically patterned layer of the first group III-nitride. The layer of second group III-nitride has a pattern of columnar holes or trenches therein. The first and second group III-nitrides have different alloy compositions.

BRIEF DESCRIPTION OF THE DRAWINGS

In the Figures and text like reference numbers refer to similar elements.

DETAILED DESCRIPTION OF ILLUSTRATIVE EMBODIMENTS

The chemical stability of the bond between group III metals and nitrogen causes group III-nitride semiconductors to be chemically resistant to many etchants. Nevertheless, aqueous solutions of strong bases will etch a nitrogen-polar surface of a layer of group III-nitride. Such wet etchants are able to mechanically pattern a group III-nitride layer that is already been polarity patterned. Exemplary patterned surfaces produce field-emitter arrays, as shown in FIGS. 1A-1B, and photonic bandgap structures, as shown in FIGS. 2, 2A, and 2B.

Figure 1A:
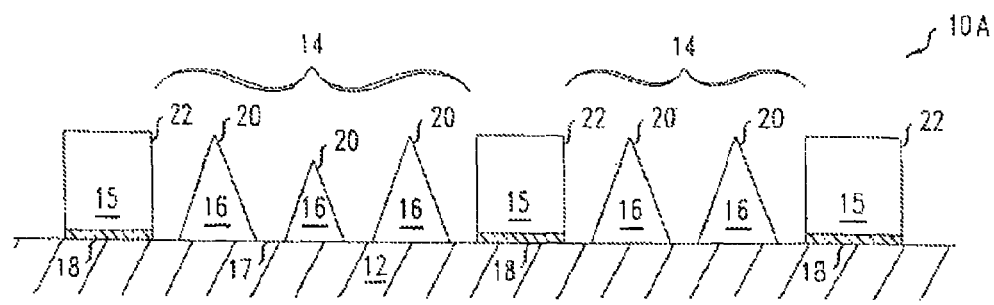
FIG. 1A is a cross-sectional view of a planar structure for a field-emitter array of group III-nitride.
Figure 1B:
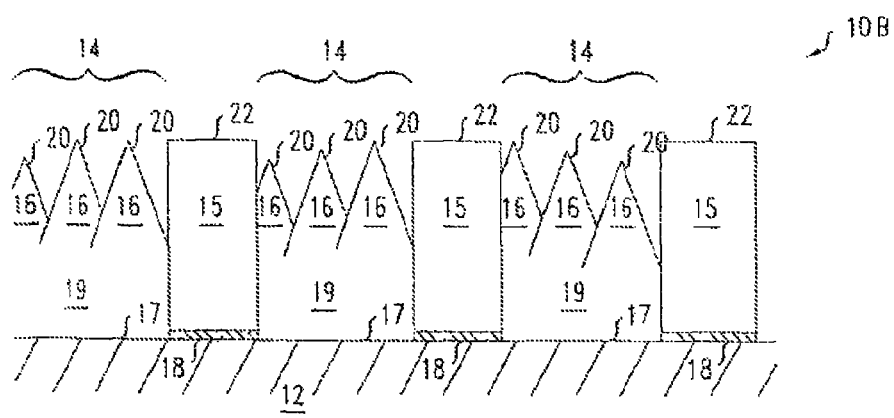
FIG. 1B is a cross-sectional view of another planar structure for a field-emitter array of group III-nitride field-emitters.
Figure 2:
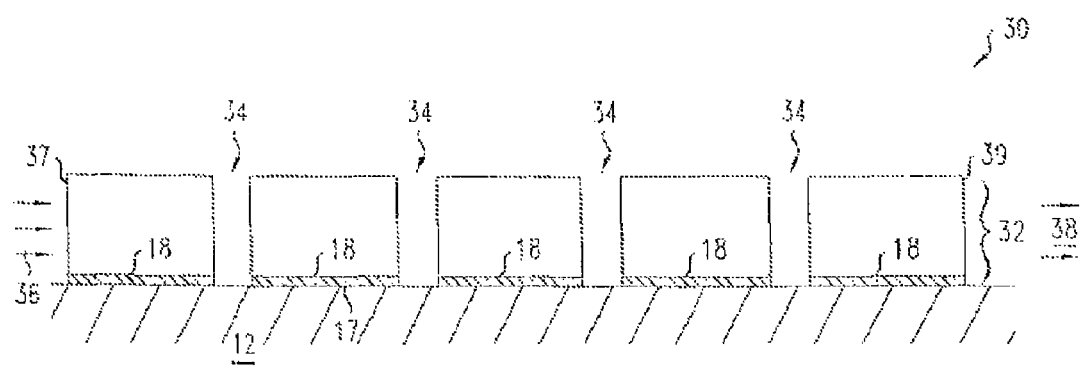
FIG. 2 is a cross-sectional view of a structure that incorporates a layer of group III-nitride that is mechanically periodically patterned with holes or trenches.
Figure 2A:
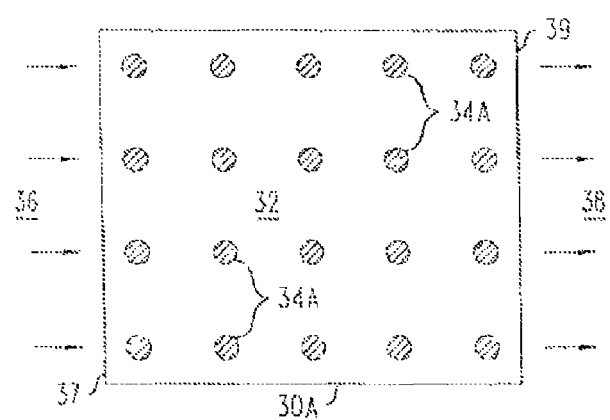
FIG. 2A is top view of one embodiment of photonic bandgap device that incorporates a structure represented by the structure of FIG. 2.
Figure 2B:
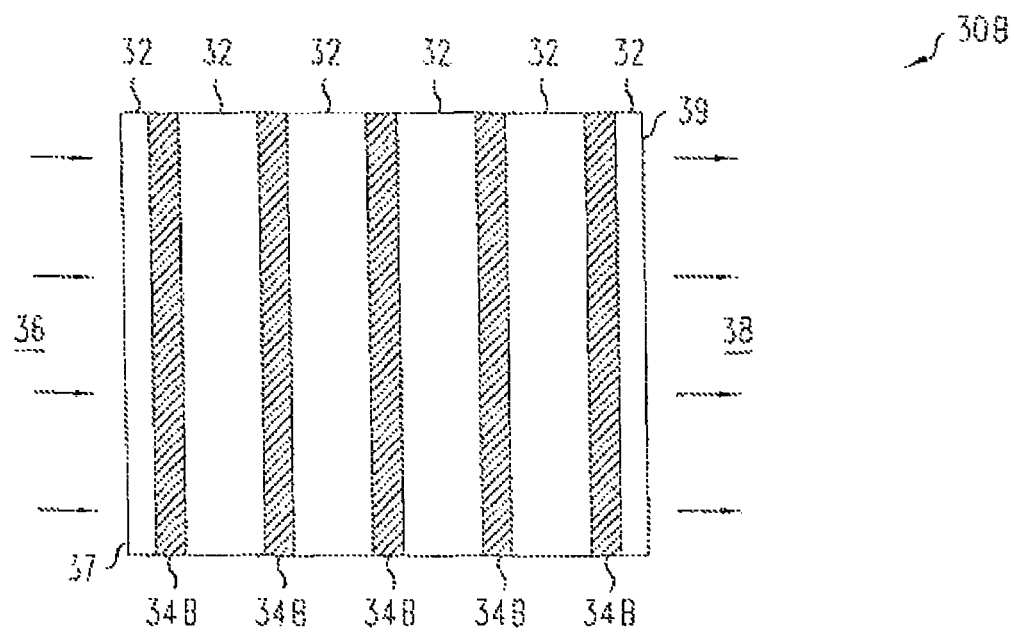
FIG. 2B is top view of another embodiment of a photonic bandgap device that incorporates a structure represented by the structure of FIG. 2.

FIG. 1A shows a field-emitter array 10A. The field emitter array 10A includes a substrate 12 and a regular pattern of laterally inter-dispersed columnar first and second regions 14, 15. The first and second regions 14, 15 cover a planar surface 17 of the substrate 12. The substrate 12 is a crystalline material such as silicon carbide (SiC) or (0 0 0 1)-plane sapphire. The first and second regions 15, 16 include respective (0 0 0 1)-polarity and (0 0 0 $\bar{1}$)-polarity forms of a group III-nitride. The group III-nitride of the regions 14, 15 has a wide lattice mismatch with the planar surface 17 of the substrate 12.

Herein, the (0 0 0 $\bar{1}$)-polarity and (0 0 0 1)-polarity forms of a group III-nitrides are referred to as the N-polar and metal-polar forms. The N-polar and metal-polar forms have opposite intrinsic polarizations. The free surfaces of flat N-polar and metal-polar layers terminate with layers of nitrogen atoms and group III-metal atoms, respectively.

The first and second columnar regions 14, 15 have physically different surfaces and thus, form a mechanically patterned layer of group III-nitride on the substrate 12. The first regions 14 include one or more hexagonal pyramids 16 of the group III-nitride. Thus, the first regions 14 have non-flat exposed surfaces, which include sharp tips 20. The second regions 15 include smooth layers of the group nitride and are devoid of pyramidal structures. Thus, exposed surfaces 22 of the second regions 15 are smooth and flat. The surfaces 22 of the second regions 15 are also farther above the planar surface 17 of the substrate 12 than the highest tips 20 in the first regions 14.

The hexagonal pyramids 16 of the first regions 14 have sharp apical points 20 and thus, can function as field emitters. The apical tips 20 have diameters of less than 100 nanometers (nm). In embodiments where the group III-nitride is GaN, the pyramids 16 have tips 20 with diameters of less than about 20 nm-30 nm and have faces that make angles of about 56°-58° with the planar surface 17. The pyramids 16 have six faces that are (1 0 $\bar{1}$ $\bar{1}$) facets.

Within a single first region 14, the distribution of the hexagonal pyramids 16 and apical rips 90 is random. Various first regions 14 may have different numbers of the hexagonal pyramids 16. The sizes of the first regions 14 are constant, because the inter-dispersed second regions 15 have the same size and regular lateral distribution.

In the second regions 15, the layer of first group III-nitride rests on a much thinner base layer 18 that is made of a second group III-nitride. The second group III nitride has a wide lattice mismatch with the planar surface 17 of the substrate 12. More importantly, the second group III-nitride grows with metal-polarity on the surface 17 of the substrate 12.

FIG. 1B shows an alternate embodiment of a field-emitter array 10B. The field emitter array 10B includes a substrate 12 and a regular pattern of inter-dispersed columnar first and second regions 14, 15 as already described with respect to FIG. 1A. In the field-emitter array 10B, the second regions 14 include overlapping hexagonal pyramids 16 rather than isolated pyramids 16 as in the field-emitter array 10A. Also, the pyramids 16 have a range of sizes and rest on a thick layer 19 of N-polar group III-nitride rather than directly on the planar surface 17 as in the field-emitter array 10A of FIG. 1A. In the field-emitter array 10B, the hexagonal pyramids 16 still have sharp apical points 20 and thus, can still function effectively as field-emitters. The apical tips 20 are still lower than die exposed top surfaces 22 of the second regions 15.

Figure 1C:
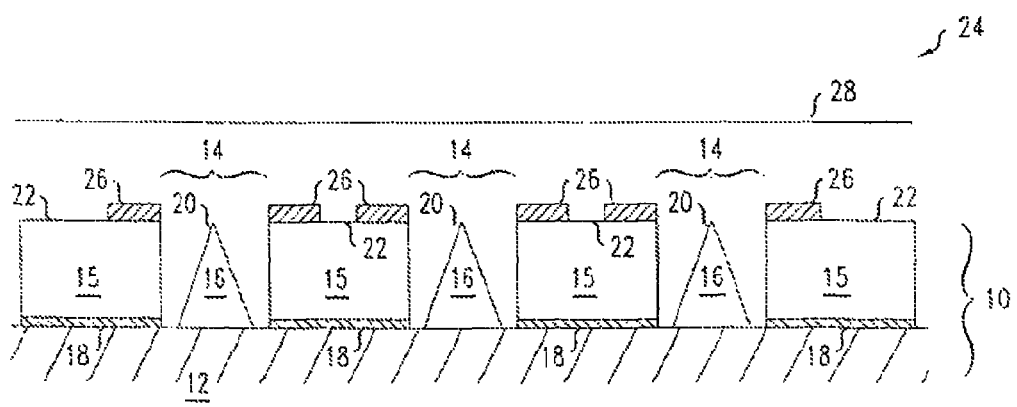
FIG. 1C shows a flat panel image display that incorporates the field-emission array of FIG. 1A or 1B.

FIG. 1C shows art embodiment of a flat panel image display 24. The display 24 incorporates a field-emitter array 10, e.g., array 10A or 10B from FIGS. 1A and 1B. The display 24 also includes metallic electrodes 26 and a phosphor screen 28. The metallic electrodes 26 are supported by the flat top surface 22 of the field emitter array's second regions 15. The top surfaces 22 support the metallic electrodes 26 along a plane that is nearer to the phosphor screen 28 than are the tips 20 themselves. For that reason, the metallic electrodes 26 are able to control emission of electrons from the field-emitter array. The metallic electrodes 26 function as control gates for field-emitters in adjacent first regions 14. Supporting the metallic electrodes 26 on the second regions 22 conveniently avoids a need to self-align the electrodes on individual tips 20. Such an alignment process would be complex, because the positions of the tips 20 are random in individual first regions 14.

FIG. 2 shows another structure 30 that has a mechanically patterned layer 32 of a first group III-nitride. The layer 32 is located on a planar surface 17 of crystalline substrate 12 e.g., the (0 0 0 1)-plane of a sapphire substrate. The layer 32 includes a regular array of identical columnar holes or trenches 34. The holes or trenches 34 have substantially rectangular cross sections and traverse the entire thickness of layer 32. The layer 32 rests on a mechanically patterned base layer 18. The base layer 13 is a second crystalline group III-nitride with a different alloy composition than the first group III-nitride. The base layer 18 aligns epitaxially on the planar surface 17 to be group III metal-polar.

For the pair of layers 18 and 32, exemplary pairs of second and first group III-nitride semiconductors are: the pair AlN and GaN or the pair AlN and AlGaN.

The layer 32 has thickness that is typically 100-10,000 times than the thickness of the base layer 18. An exemplary GaN layer 32 has a thickness of 30 μm or more, and an exemplary AlN base layer 18 has a thickness of only about 20 nm-30 nm. The base layer 18 only has to be thick enough to align the polarization of another layer located on the base layer 18.

In optical devices, the layer 32 usually functions as an optical core of a planar waveguide. The waveguide receives input light 36 via an edge 37 and transmits output light 38 via an opposite edge 39. Such edge coupling of the layer 32 to optical fibers and other optical waveguides is more efficient for embodiments in which the layer 32 is thicker. It is thus, advantageous that the layer 32 can be relatively thick, i.e., 30 μm or more, because such a thicker layer 32 enables efficient end coupling to standard optical fibers and waveguides.

The patterned thick layer 32 can, e.g., be a thick photonic bandgap structure. Thick photonic bandgap structures provide more efficient optical edge coupling than thinner photonic bandgap structures that can be made by dry etching.

FIGS. 2A and 2B show two exemplary planar photonic bandgap structures 30A, 30D. Cross-sectional views through the structures 30A and 30B are faithfully represented in FIG. 2. The structures 30A and 30B include a layer 32 of a metal-polar group III-nitride, i.e., (0 0 0 1)-plane group III-nitride. The layer 32 is located on the top surface of the crystalline substrate 12 shown in FIG. 2. The layer 32 is mechanically patterned by an array of substantially identical columnar features 34A, 34B. The columnar features 34A, 34B are holes and trenches in the structures 30A and 30B, respectively.

The holes 34A and trenches 34B form regular arrays that have one and two discrete lattice symmetries, respectively. For this reason, the holes 34A and trenches 34D produce respective 2-dimensional and 1-dimensional periodic modulations of the refractive index of the layer 32. The refractive index modulations produce a photonic bandgap structure for selected lattice lengths in the arrays. Lattice lengths that are odd integral multiples of ¼ times the effective wavelength of input light in the medium will produce photonic bandgap structures.

Figure 2C:
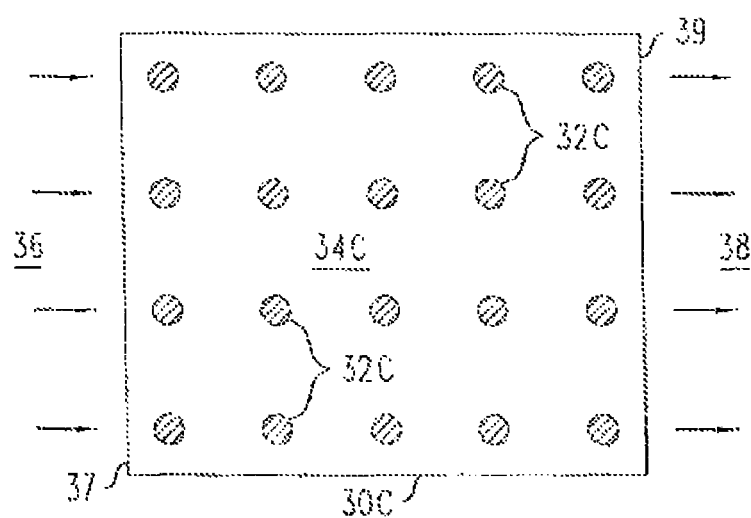
FIG. 2C is top view of another embodiment of a photonic bandgap device that incorporates a structure represented by the structure of FIG. 2.

FIG. 2C shows a photonic bandgap structure 30C similar to the photonic bandgap structure 30A of FIG. 2A except that the holes and the group III-nitride material layer are exchanged. In the structure 30C, the layer 32C of group nitride is a two-dimensional array of isolated pillars. Between the group III-nitride pillars is an interconnected two-dimensional pattern of trenches 34C. The trenches 34C isolate the pillars from each other.

Figure 3:
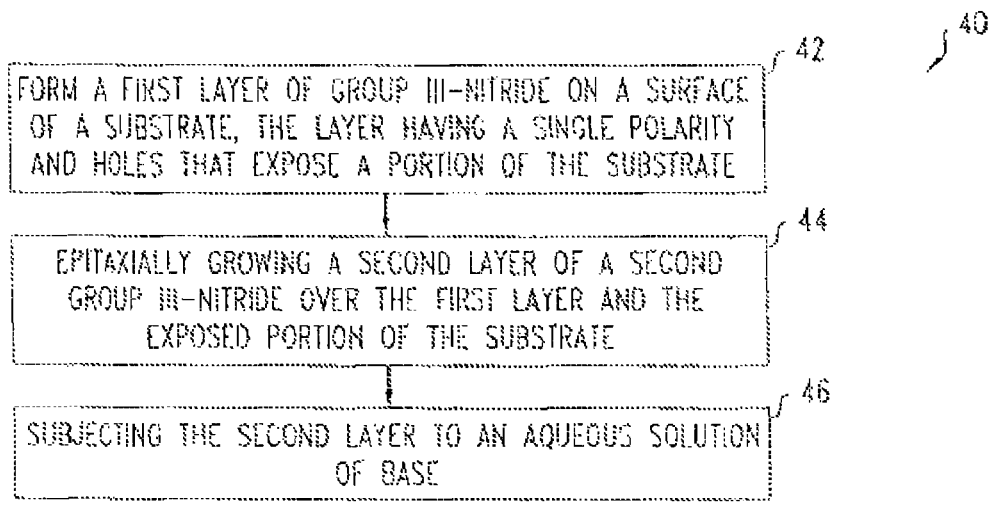
FIG. 3 is a flow chart illustrating a method for fabricating structures with patterned layers of group III-nitride as shown in FIGS. 1A-1B, 2, 2A, and 2B.

FIG. 3 illustrates a method 40 for fabricating a structure with a mechanically patterned layer of group III-nitride, e.g., as shown in FIG. 1A-1B, 2, 2A, or 2B.

The method 40 includes forming a metal-polarity first layer of a first group III-nitride on a selected planar surface of a crystalline substrate (step 42). Forming the layer includes performing an epitaxial growth of a first group III-nitride, and mechanically patterning the layer lithographically. The composition of the first group III-nitride is selected to insure that the epitaxial growth produces a metal-polarity layer. The mechanical patterning produces a regular pattern of identical holes or trenches that expose a portion of the substrate through the layer.

Next, the method 40 includes epitaxially growing a thicker second layer of a second group III-nitride over the first layer and the exposed portion of the substrate (step 44). Over the first layer, the second layer grows with metal-polarity. Over the exposed portion of the substrate, the second layer glows with N-polarity. The first and second group III-nitrides have different alloy compositions, e.g., AlN and GaN, and have a wide lattice-mismatch with the substrate.

Finally, the method 40 also includes subjecting the second layer to an aqueous solution of a strong base such as potassium hydroxide (KOH) or sodium hydroxide (NaOH) (step 46). The aqueous solution mechanically patterns the second layer by selectively etching N-polar surfaces. Aqueous solutions of strong bases do not significantly etch metal-polar surfaces of group III-nitrides. The form of the mechanical patterning qualitatively depends on the etching time and the concentration of the etchant.

Figure 4:
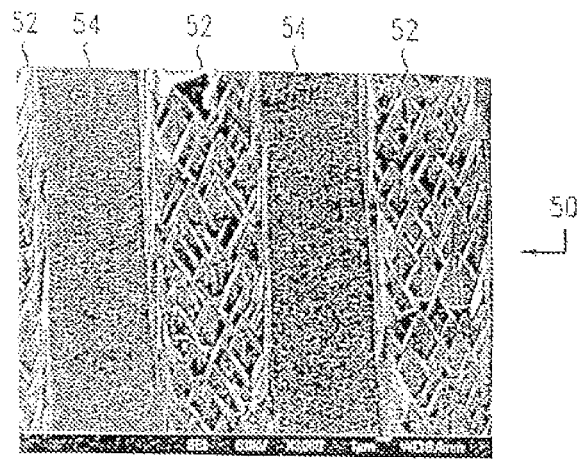
FIG. 4 is oblique view scanning electron micrograph (SEM) of a structure made by an embodiment of the method of FIG. 3 in which the wet etch time is short.

FIG. 4 is a scanning electron Micrograph (SEM) of a polarity striped GaN layer 50 that has been wet etched with a 2 molar aqueous solution of KOH for 45 minutes. The GaN layer was maintained at a temperature of about 90° C. during the wet etch.

The etched GaN layer 50 has N-polar GaN stripes 52 and Ga-polar GaN stripes 54. The relatively short etch has removed significant material from the N polar GaN stripes 52 without removing significant material from the Ga-polar GaN stripes 54. In the N-polar stripes 52, the etch produces a surface formed of densely packed hexagonal GaN pyramids, e.g., as shown in FIG. 1B. The pyramids have various sizes and sharp apical tips with diameters of about 20-30 nm or less.

Measurements indicate that the pyramid density, $\rho_A$, varies with etching temperature, T, as: $[\rho_A]^{-1}=[\rho_{A0}]^{-1}\exp(-E_a/k_BT)$ where $k_B$ is Boltzmann's constant. For a 2 molar solution of KOH, a 15 minute etch, and temperatures between 25° C. and 100° C., measurements show that the activation energy E, equal to about 0.537 eV.

The inventors believe that the wet KOH etch produces a distribution of packed hexagonal GaN pyramids, in part, due to the Ga-polar GaN stripes 54 that are not etched. In particular, the Ga-polar stripes laterally confine the N-polar stripes 52 so that the etchant attacks top surface of the N-polar stripes 52 rather than side surfaces thereof. The KOH wet etch produces a dense-packing of sharp tipped hexagonal GaN pyramids when the N-polar GaN stripes 52 have widths of about 7 microns (μm). It is believed that a dense packing of hexagonal pyramids will also result from a wet KOH etch of GaN surfaces in which N-polar GaN stripes have widths of about 100 μm or less. It is not however, believed that a wet KOH etch of an unconfined planar surface N-polar GaN will produce a dense packing of sharp tipped, hexagonal GaN pyramids.

Figure 5:
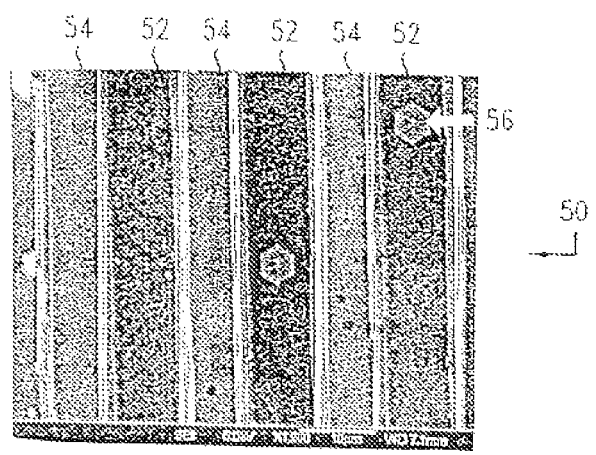
FIG. 5 is top view SEM of a structure made by an embodiment of the method of FIG. 3 in which the wet etch time is of intermediate length.

FIG. 5 is an SEM image showing a polarity-striped GaN layer 50 that has been wet etched with a 4 molar aqueous solution of KOH for 60 minutes. Again, the GaN layer was maintained at a temperature of about 90° C. during the wet etch.

The more intense etch has removed all material from the N-polar GaN stripes 52 except for isolated hexagonal GaN pyramids 56. The wet etch stopped an the underlying crystalline sapphire substrate. This intermediate length etch produces patterning like that of FIG. 1A, at least, within individual N-polar GaN stripes 52. Within these regions, the hexagonal GaN pyramids 56 have a random distribution.

Figure 6:
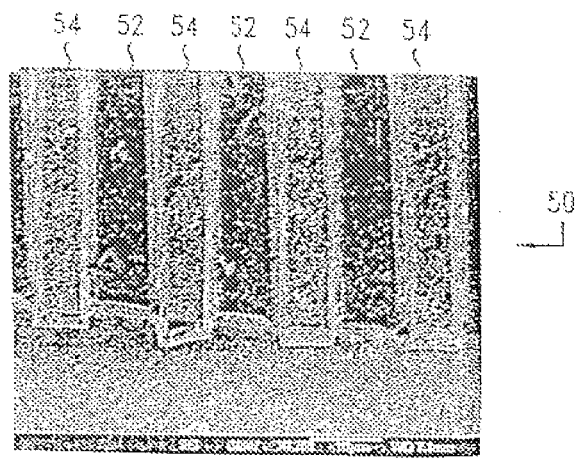
FIG. 6 is a top view SEM of a structure made by an embodiment of method of FIG. 3 in which the wet etch time is long.

FIG. 6 is an SEM image of a polarity-striped GaN layer 50 that has been etched with a 4 molar aqueous solution of KOH for more than 60 minutes. Again, the GaN layer is maintained at a temperature of 25° C.-125° C. and preferably of about 90° C. during the wet etch.

This longer etch has completely removed the original N-polar GaN stripes 52. As a result, substantially vertical trenches separate the unetched Ga-polar stripes 51. The sidewalls of the Ga-polar stripes 54 are not completely vertical, because the wet etchant slowly attacks sidewalls of Ga-polar GaN layers. Aqueous solutions with higher concentrations of KOH than 4 molar tend to erode exposed side and end surfaces of Ga-polar stripes 54. The resulting structure has a patterned Ga-polar layer of group III-nitride like structures 30, 30A, and 30B of FIGS. 2, 2A, and 2B.

Figure 7:
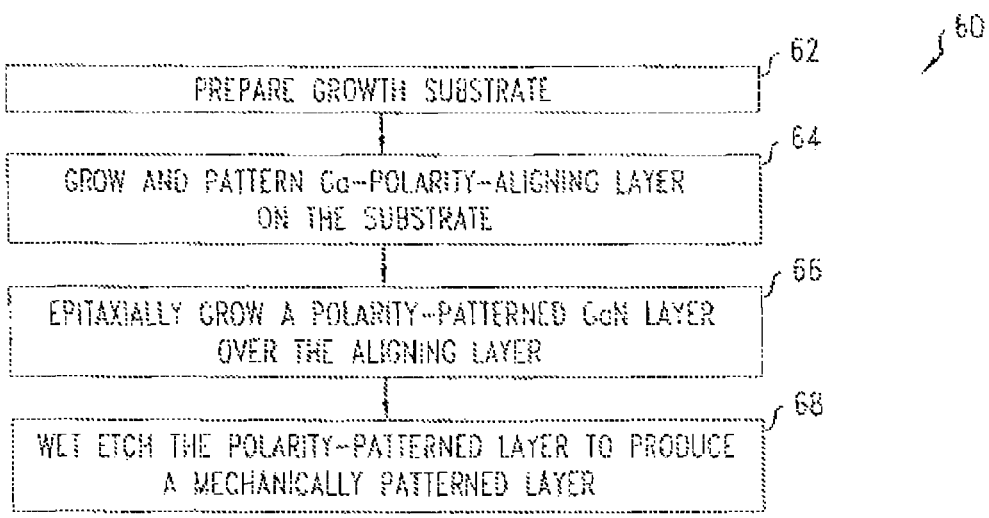
FIG. 7 is a flow chart for specific method of fabricating GaN structures with patterned layers as shown in FIGS. 1A-1B, 2, 2A, and 2B.

FIG. 7 illustrates a method 60 for fabricating GaN structures that are mechanically patterned as in FIGS. 1A, 1B, 2, 2A, and 2B. The method 60 includes preparing a planar sapphire growth substrate (step 62), growing and patterning a Ga-polarity aligning layer on the substrate (step 64), and epitaxially growing a polarity-patterned GaN layer over the aligning layer (step 66). The method 60 also includes wet etching the GaN layer to produce mechanical patterning by selectively removing GaN in the N-phase regions (step 68).

In step 62, preparing the sapphire growth subsume includes cleaning a (0 0 0 1)-plane surface of a crystalline sapphire substrate. The cleaning includes washing the surface for 1 minute in an aqueous cleaning solution. Mixing a first aqueous solution having about 96 weight % $H_2SO_4$ with a second aqueous solution having about 30 weight % $H_2O_2$ produces the aqueous cleaning solution. During the mixing, about 10 volume parts of the first solution are combined with one volume part of the second solution. The cleaning also includes rinsing the washed surface with de-ionized water and then spin-drying the sapphire growth substrate.

In step 62, preparing the growth substrate also includes degassing the sapphire substrate in the buffer chamber of a molecular beam epitaxy (MBE) system at about 200° C. The degassing continues until the chamber pressure is below about $5 \times 10^{-9}$ Torr. After the degassing, the sapphire substrate is transferred to the growth chamber of the plasma-assisted MBE system.

In step 64, growing and patterning a Ga-polarity aligning layer includes performing an MBE growth of an AlN layer on the sapphire substrate (substep 64a). To perform the MBE growth, the temperature of the growth chamber is raised at a rate of about 8° C. per minute to a final temperature of about 720° C. The sapphire substrate is maintained at a uniform temperature with the aid of a 300 nm thick layer of titanium deposited on the substrate's back surface.

The MBE system grows the AlN layer to a thickness of about 20 nm to 30 nm. This thin AlN layer is sufficiently thick to cover the entire exposed surface of the sapphire substrate. In the model 32P Molecular Beam Epitaxy system made by Riber Corporation of 133 boulevard National, Boite Postale 231, 92503 Rueil Malmaison France, the growth conditions are: Al effusion cell temperature of about 1050° C., nitrogen flow rate of about 2 sccm, and RF power of about 500 watts (W).

In step 64, forming the patterned AlN layer 12 includes performing an MBE growth of about 50 nm of protective GaN on the already grown AlN layer (substep 64b). The GaN layer protects the underlying AlN from oxidation during subsequent removal of the substrate from the MBE growth chamber. Growth conditions for the GaN layer are similar to those for the MBE growth of the AlN layer except that the temperature is raised in the Ga effusion cell rather than in die Al effusion cell. During this growth, the Ga effusion cell has a temperature of about 1000° C. to about 1020° C.

After cooling the sapphire substrate to about 200° C., the GaN/AlN layer is lithographically patterned with a regular army of windows that expose selected portions of the sapphire substrate (substep 64c). The patterning step includes forming a photoresist mask on the GaN layer and then, performing a conventional chlorine-based plasma etch to remove unmasked portions of the GaN/AlN layer. Exemplary conditions for the plasma etch are: RF source power of about 300-500 watts, source bias of 100 volts to 200 volts, chlorine-argon flow rate of about 10-25 sccm (20% to 50% of the flow being argon), and a gas pressure of about 1 millitorr to about 10 millitorr. The plasma etch produces a preselected pattern of GaN topped AlN regions.

After the plasma etch, the sapphire substrate with a pattern of GaN topped AlN regions is cleaned in an aqueous solution of HCl, rinsed in de-ionized water, and blown dry with nitrogen. This aqueous cleaning solution includes between about 36.5 weight % HCl and about 48 weight % HCl. Then, the above-described steps are again used to reintroduce the sapphire substrate into the MBE system.

In step 66, epitaxially growing a GaN layer includes performing a plasma enhanced MBE growth of a GaN layer to a thickness of about 2 μm or more. During the MBE growth, the system conditions, are: Ga effusion cell temperature of about 1000° C. to about 1020° C., nitrogen flow rate of about 2 sccm, and RF power of about 500 watts (W). During, this growth, the GaN topped AlN regions initiate growth of Ga-polar GaN, and the exposed regions of the sapphire substrate 10 initiate growth of N-polar GaN.

In step 68, the anisotropic wet etching includes immersing the GaN layer and substrate in an aqueous solution of KOH. Exemplary wet etches use 1 to 4 molar aqueous solutions of KOH and etch periods of about 15 minutes to 60 minutes at temperatures of 100° C. The concentration of KOH and etch time determines the qualitative form of the resulting mechanical patterning as illustrated in FIGS. 4-6. The wet etch selectively removes GaN with N-polarity. Nevertheless, wet etches with more basic aqueous solutions than 4 molar KOH can erode end faces of Ga-polar portions of the original GaN layer.

From the disclosure, drawings, and claims, other embodiments of the invention will be apparent to those skilled in the art.

What we claim is:

1. A method of fabricating a structure, comprising:
providing a substrate with a planar surface;
providing a crystalline layer of a group III-nitride over the surface of the substrate; and
subjecting the layer to base to etch a top surface of the layer such that a plurality of pyramids are formed from nitrogen-polarity first lateral regions of the layer and pyramids are not formed in an adjacent second lateral region of the layer, the second lateral region being located between the first lateral regions; and
wherein the structure has a metallic electrode located on a flat surface of the second lateral region of the layer.

2. The method of claim 1, wherein the subjecting forms the pyramids by etching a portion of the top surface of the layer having metal-polarity.

3. The method of claim 1, wherein the subjecting does not significantly etch a portion of the top surface of the layer that has metal-polarity.

4. The method of claim 3, wherein the subjecting forms the pyramids by etching a portion of the top surface of the layer that has metal-polarity.

5. The method of claim 1, wherein the group III-nitride comprises gallium.

6. The method of claim 1, wherein the layer is an epitaxially grown layer.

7. The method of claim 1, wherein the layer comprises a gallium nitride layer.

8. The method of claim 1, wherein the pyramids spatially overlap.

9. The method of claim 1, wherein tips of the pyramids have an irregular spatial distribution.

10. The method of claim 1, wherein the pyramids are physically separated from any electrode.

11. The method of claim 1, wherein the electrode is located on a flat portion of the top surface.

12. The method of claim 1, wherein a portion of the layer of the group III-nitride is located on the layer of another group III-nitride alloy.

13. The method of claim 1, wherein the base is aqueous base.

14. The method of claim 13, wherein the subjecting does not significantly etch a portion of the top surface of the layer that has metal-polarity.

15. The method of claim 13, wherein the layer is an epitaxially grown layer.

16. The method of claim 13, wherein the layer comprises gallium nitride.

17. The method of claim 13, wherein the pyramids spatially overlap.

18. The method of claim 13, wherein tips of the pyramids have an irregular spatial distribution.

19. The method of claim 13, further comprising providing a metal electrode on a portion of a surface of the layer.

20. The method of claim 13, wherein the pyramids are physically separated from any electrode.

21. The method of claim 13, wherein the electrode is located on a flat portion of the top surface.

* * * * *